United States Patent [19]

Haefling et al.

[11] Patent Number: 4,691,854

[45] Date of Patent: Sep. 8, 1987

[54] COATINGS FOR CERAMIC BONDING CAPILLARIES

[75] Inventors: James F. Haefling, Richardson; James W. Pritchard, Garland; Roger J. Stierman, Richardson, all of Tex.

[73] Assignee: Texas Instruments Incorporated, Dallas, Tex.

[21] Appl. No.: 684,654

[22] Filed: Dec. 21, 1984

[51] Int. Cl.⁴ ............................................. B23K 37/00
[52] U.S. Cl. .................................. 228/4.5; 228/44.7; 228/54; 219/56.21
[58] Field of Search .................. 228/4.5, 44.7, 46, 54, 228/55; 219/56.21, 56.22, 137.43, 137.44

[56] References Cited

U.S. PATENT DOCUMENTS

| | | | |
|---|---|---|---|
| 2,501,616 | 3/1950 | Robinson | 228/54 |
| 3,341,660 | 2/1972 | Adams et al. | |
| 3,358,897 | 12/1967 | Christensen | 228/54 |
| 3,542,277 | 11/1970 | Andrews | 228/54 |
| 3,863,827 | 2/1975 | Foulke et al. | |
| 3,973,713 | 8/1976 | Furuya et al. | |
| 4,327,860 | 5/1982 | Kirshenboin et al. | |
| 4,340,166 | 7/1983 | Bilane et al. | |
| 4,387,283 | 6/1983 | Peterson et al. | |

FOREIGN PATENT DOCUMENTS

| | | | |
|---|---|---|---|
| 2164822 | 12/1971 | Fed. Rep. of Germany | 228/54 |
| 0054281 | 4/1980 | Japan | 219/137.43 |
| 0133979 | 1/1984 | Japan | 228/54 |
| 487178 | 6/1938 | United Kingdom | 228/54 |
| 0582073 | 11/1977 | U.S.S.R. | 219/137.44 |

*Primary Examiner*—Nicholas P. Godici
*Assistant Examiner*—Karen Skillman
*Attorney, Agent, or Firm*—Frederick J. Telecky, Jr.; James T. Comfort; Melvin Sharp

[57] ABSTRACT

A bonding apparatus for bonding lead wires to a semiconductor surface includes a supply spool that contains a supply of the bonding wire that is fed to a capillary that is made of a non-conductive material. An electric arc forms a ball on the tip of the arc and the ball is retracted into the capillary. The ball is heated and compressed onto the semiconductor substrate and is then stitched over to a second bonding point which in most applications is the interface pin of the semiconductor device. The capillary has a non-conductive end that prevents coating of the capillary tip with the molten metal that results from the arcing of the bonding wire.

10 Claims, 10 Drawing Figures

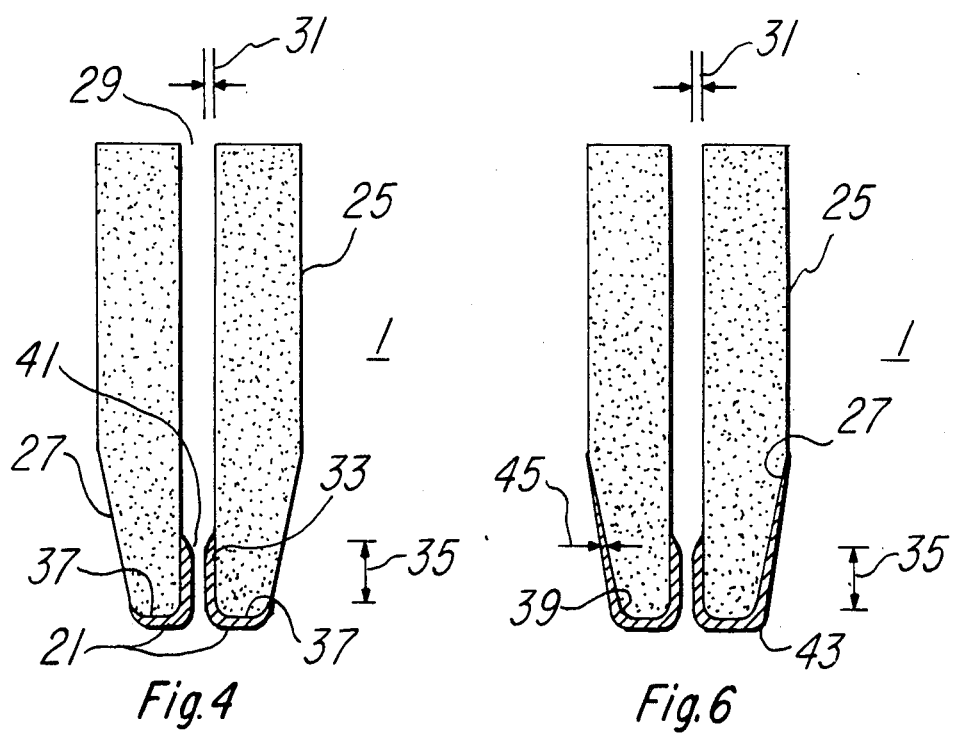
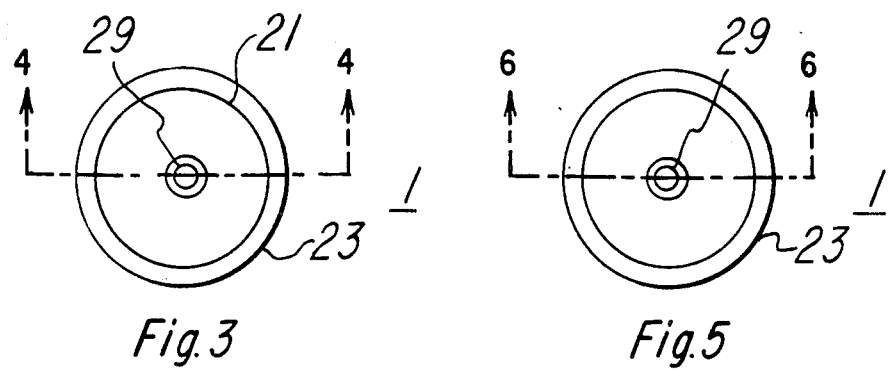

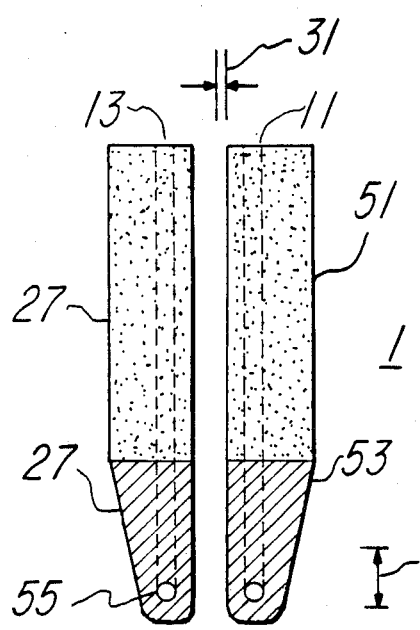
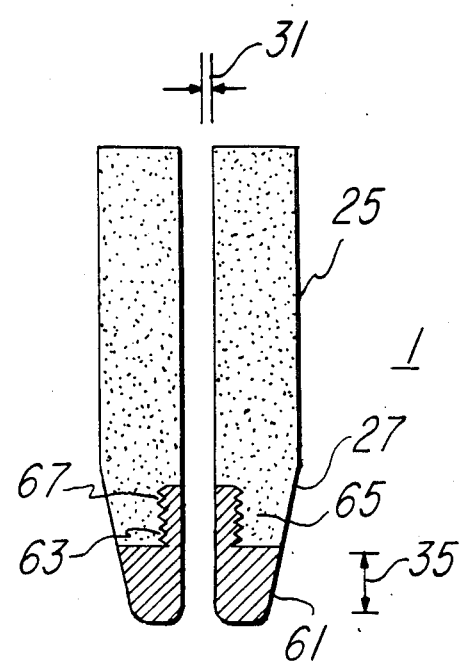
Fig. 8　　　　　　Fig. 10
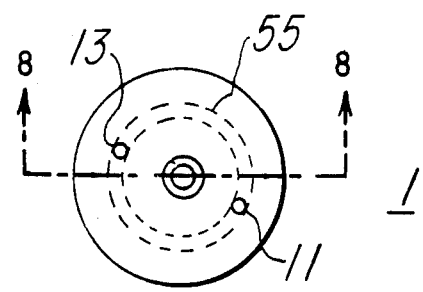
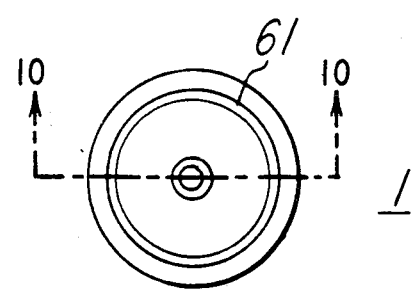
Fig. 7　　　　　　Fig. 9

COATINGS FOR CERAMIC BONDING CAPILLARIES

BACKGROUND OF THE INVENTION

This invention relates to an apparatus and method of forming metallic balls for ball bonding of metallic wire to semiconductor devices. More particularly, this invention relates to capillaries used in the bonding operation.

The basic ball bonding technique is shown in U.S. Pat. No. 3,641,660 issued to Adams et al on Feb. 15, 1972 and entitled "The Method of Ball Bonding With an Automatic Semiconductor Bonding Machine". Other improvements on the basic ball bonding apparatus were included in U.S. Pat. No. 4,387,238 entitled "Apparatus and Method of Forming Aluminum Balls for Ball Bonding" and additional methods and apparatuses are disclosed in U.S. Pat. Nos. 4,327,860; 4,340,166; 3,973,713; and 3,863,827.

Wire bonding of semiconductor devices is achieved through a thermal compression process utilizing a ceramic capillary through which the bonding wire is threaded. In the bonding process, a ball of molten metal is formed by an electric arc on the end of the bonding wire. The bonding wire is then bonded to the semiconductor surface. The arc discharge causes a metal splatter during the ball making process of the bonding operation which coats the end of the capillary tip through which the bonding wire is fed. This coating constitutes a discharge point for the electric arc. Some of the metal splatter penetrates the grain structure of the capillary and during subsequent arcing this penetrated metal splatter causes dislodgement of ceramic particles which results in erosion of the work surface of the capillary. This wearing of the metal surface reduces the life time of the capillary. An additional problem that results in the splattered metal that is coated on the capillary tip is that jagged edges are formed which abrade the lead wires that are being bonded to the semiconductor devices. The damaged lead wires then causes these devices to fail.

SUMMARY OF THE INVENTION

A bonding apparatus for bonding lead wires to a semiconductor surface includes a supply spool that contains a supply of the bonding wire that is fed to a capillary that is made of a non-conductive material. An electric arc forms a ball on the tip of the arc and the ball is retracted into the capillary. The ball is heated and compressed onto the semiconductor substrate and is then stitched over to a second bonding point which in most applications is the interface pin of the semiconductor device. The capillary has a non-conductive end that prevents coating of the capillary tip with the molten metal that results from the arcing of the bonding wire.

The capillary is a tubular shaped device that has a center feed-through for passing the wire through and on one end there is a conical shaped member. The tubular shaped member is made of a first non-conductive material such as ceramic and the second member is made of a second non-conductive material. The second non-conductive material can be either a deposit of a metallic oxide such as aluminum or Si oxide on the ceramic material or a machined metal tip, whereas, the first non-conductive material can be either a sintered aluminum oxide ceramic or a heat resistive plastic.

It is an object of the invention to provide a capillary for a wire bonding machine.

It is another object of this invention to provide a bonding machine that includes a capillary which is resistant to the collection of metal splatter from the bonding operation.

It is still another object of this invention to provide a capillary for a wire bonding machine that has an extended life of operation.

It is still yet another object of the invention to provide a capillary for a bonding machine that prevents the bonding wire from being damaged by abrasion of the wire by metal splatter on the tip of the capillary.

It is yet another object of the invention to provide a capillary for a bonding machine that allows for smooth passage of the bonding wire through the capillary tip.

BRIEF DESCRIPTION OF THE DRAWINGS

FIG. 3, FIG. 5, FIG. 7 and FIG. 9 are the top view of different capillaries used in the bonding machine of FIG. 1; and FIG. 4, FIG. 6, FIG. 8 and FIG. 10 are sectional views of respective capillaries.

DETAILED DESCRIPTION OF THE EMBODIMENTS

Figure 1:
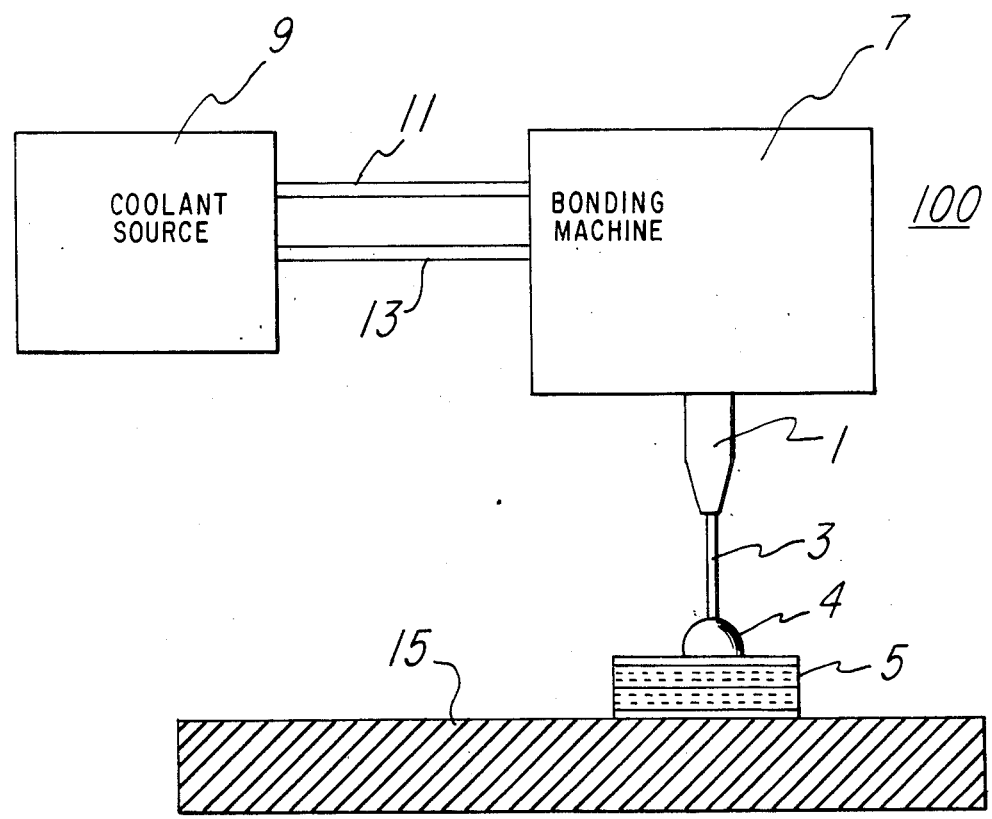
FIG. 1 is a block diagram of a bonding machine containing the capillary according to the invention.

In FIG. 1, there is shown a bonding apparatus 100 that includes a bonding machine 7 that feeds a bonding wire 3 through a capillary 1 for bonding the bonding wire 3 to a metallized surface 5 attached to a semiconductor substrate 15. The bonding machine 7 causes a ball to be formed on the metallized surface 5. In one embodiment, a coolant source 9 provides a flow of coolant through the conductors 11 and 13 to the bonding machine 7 for cooling of the tip of the capillary 1.

Figure 2:
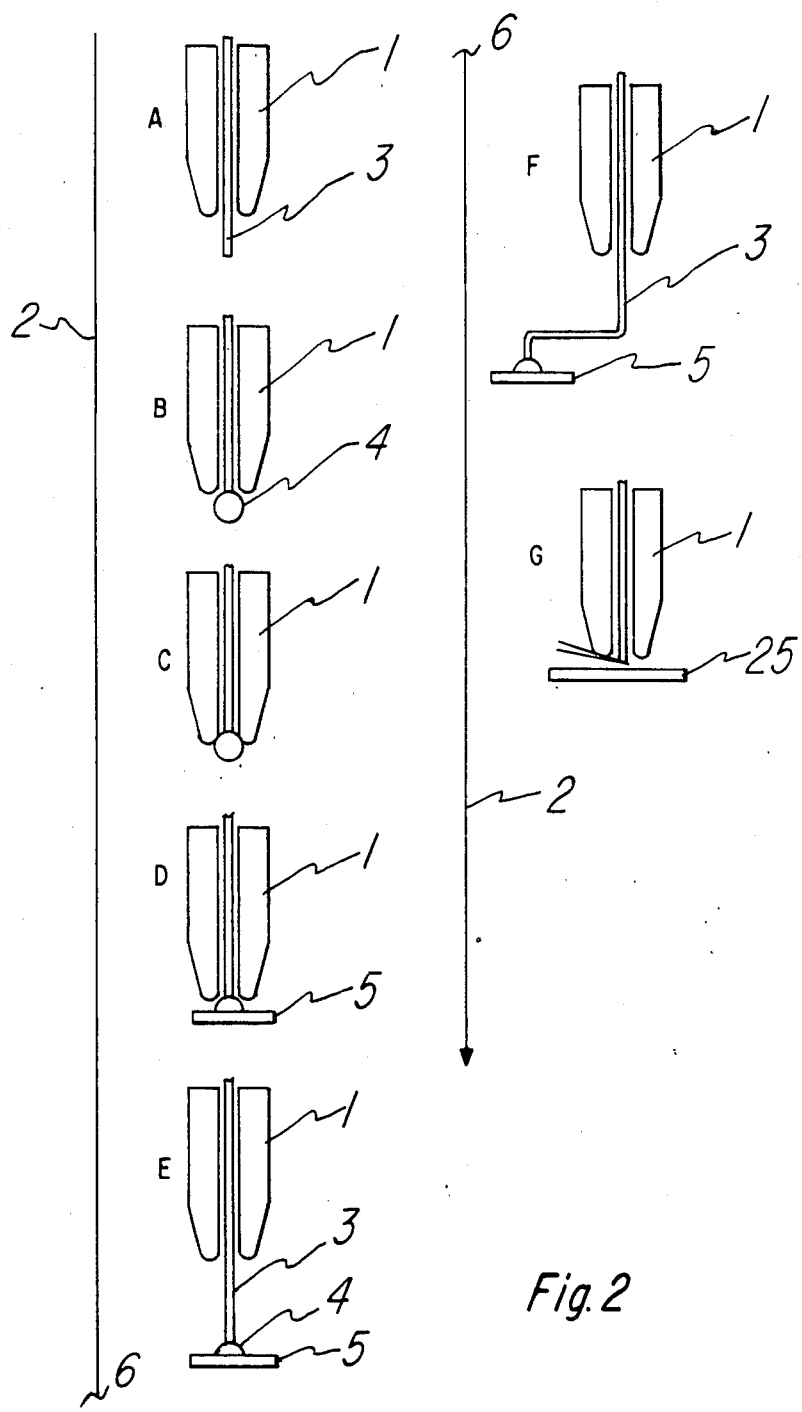
FIG. 2 is a time sequence diagram showing the operation of the bonding machine of FIG. 1.

The operation of the bonding machine 7 may be more readily understood by referring to FIG. 2 which is a time sequence diagram as indicated by time line 2 showing the essential operation of the bonding machine 7. At reference A the capillary passes a feedthrough wire 3 through its center opening. A ball 4 of molten metal is formed on the end of the bonding wire 3 at position B. The ball 4 of molten metal is retracted into the end of the capillary at positions C after which the capillary presses the ball formed of molten metal against the metallic surface 5 at position D. The capillary, as indicated at position E is then retracted exposing the bonding wire 3 and the ball 4 which is pressed against the metallic surface 5. The capillary is moved feeding the bonding wire to the metallic surface 5 and pressing it to a second metallic surface 25 at positions F and G. After the bonding wire 3 is connected to the second surface 25 it is cut and the process is repeated again at a second position on the semiconductor substrate 15 or on a different substrate.

As was indicated earlier, the process of forming the ball by striking an arc to the tip of the bonding wire 3 causes metal splatter on the end of the capillary 1 which shortens the lifetime of the capillary and degrades the quality of the bonding connection of the bonding wire 3 due to the abrasive action of the splatter that is on a capillary 1. In the embodiment of FIG. 3 there is shown a top view of the capillary 1 in which there is deposited on the tip of the capillary a layer of a metal oxide 21 is deposited on the tip 23 of the capillary 1. The deposition of the metal oxide is illustrated from a sectional view as seen from sectional lines IV, IV in FIG. 4 to which reference should now be made.

The capillary 1 is made of a nonconductive material such as a ceramic material which is usually compressed and sintered aluminum oxide but which may be any type of nonconductive material that can withstand both the pressure and temperatures that are developed in the bonding operation of the bonding machine 7. The capillary has a cylinder portion 25 and a conical tip 27. There is a tubular clearance through the capillary 29 through which the bonding wire 3 pass. To assist the transfer of the bonding wire through the capillary at the tubular clearance 29 the inner walls of the tubular clearance 29 are tapered as indicated by dimension lines 31. At the tip of the conical shaped portion 27 of the capillary 1, the walls of the clearance to 29 become parallel at position 33 which is indicated by dimension lines 35. In the embodiment shown in FIG. 4, a second nonconductive material 21 is deposited on the tip of the capillary 27 and in particular on the pressure bearing surface 37. Additionally, along the parallel surfaces 33 of the tip of the capillary, the second nonconductive material is also deposited as indicated at 41. Depositing of the second nonconductive material along the inner surface of the inner guide passage 29 of the capillary 1 provides a smooth passageway for the bonding wire 3. This coating is normally in the range of 2200±300 angstroms of aluminum oxide or silicon oxide.

FIGS. 5 and 6 are alternate embodiments of the invention in which FIG. 5 is an end view of a capillary 1 in which there is a coating 39 over the entire tip 27 of the capillary.

FIG. 6 is a sectional view of FIG. 5 as is seen from sectional line VI—VI in which a coating of approximately 2200 angstroms as indicated by dimension line 45 is applied to the top of the conical shaped section 27 of the capillary 1. The coating is placed over the parallel ledges of the inner surface of the center passage 29 of the capillary member and are placed inside a length as indicated by dimension lines 35. The placement of the deposit 15 of the second nonconductive material on the inside portion of the center passage 29 facilitates the guiding of the bonding wire 3 through the capillary and provides a smoother surface for its passage than does the ceramic material that the capillary is manufactured from.

FIGS. 7 and 8 are alternate embodiments of the capillary 1 of FIG. 3 in which cooling from the coolant source 9 is circulated through the capillary 1 via coolant conduits 11 and 13 and channel 55. The circulating of coolant through the capillary 1 facilitates in the removal of heat that results from the application of the electrical arc to the bonding wire 3 and due to heat transferred from the heated substrate to the tip during ball bonding and thus enables the conical shape 27 of the capillary 1 to be manufactured of a high impact resistant plastic material 53 and it is bonded to the cylindrical portion 27 of the capillary 1 which may be a ceramic material or a material 51 such as teflon or other type of plastic medium. The use of plastic, of course, provides for easy passage of the bonding wire through 3 through the capillary 1 as does the taper 31 and the coating of the inner walls the depth of dimension line 35 with the second nonconductive materials.

FIGS. 9 and 10 provide yet another embodiment of the invention in which a machined aluminum tip 61 is connected to the conical end 27 of the capillary 1 via means of threads 63 which includes a male threaded portion 65 that is a part of the machine tip 61 and a female portion 67 that is machined to the end of the conical section of the capillary 1. In the embodiment of FIGS. 9 and 10, the overall dimensions of the capillary 1 are the same as those of the prior figures and the insulation is provided by the second material which is a tip that is manufactured from a material such as aluminum which oxidizes readily and thus provides an insulating layer over its outer surfaces of aluminum oxide. Any charge that may be accumulated on the tip 61 as was the other embodiment, of course, is removed by the action of the bonding wire while still maintaining the nonconductive character of the capillary 1.

Although the invention has been described in detail, the scope of the invention is defined by the appended claims in which: We claim:

1. An apparatus for bonding a wire to interconnect first and second metalized surfaces comprising:

a ceramic non-conductive capillary means for passing a first end of wire from a supply of wire, wherein the capillary means includes a pressure bearing surface and an inner guide passage with an inner surface;

an oxide of silicon, or an oxide of aluminum, non-conducting coating on the pressure bearing surface and on the inner surface of the inner guide passage in the region near the pressure bearing surface;

forming means for forming a ball on the first end of the wire;

retracting means for retracting the ball to a first end of the capillary means;

heating means for heating the ball, first surface, and second surface to a bonding temperature;

stitching means for forming a stitch of wire from the first metalized surface to the second metalized surface and to bond the wire thereto;

wherein the layer of an oxide of silicon, or an oxide of aluminum, is for resisting the collection of metal splatter, on the surfaces of the capillary means in the region near the pressure bearing surface, resulting from the forming of the ball on the first end of the wire by drawing an arc to the first end of the wire.

2. The apparatus of claim 1 wherein the forming means for forming a ball forms the ball by striking an arc to the first end of the wire.

3. The apparatus of claim 2 wherein the ceramic non-conducting capillary means is made of sintered aluminum oxide.

4. The apparatus of claim 3 wherein the capillary means is tubular shaped.

5. The apparatus of claim 4 wherein the oxide of silicon, or oxide of aluminum, non-conducting layer also extends from the pressure bearing surface for a distance along the outer surface of the capillary means.

6. The apparatus of claim 5 wherein the oxide of silicon, or oxide of aluminum, non-conducting layer is in the range of 2200 angstroms thick.

7. A method for resisting the collection of metal splatter on the surfaces of a non-conducting ceramic capillary tube in the region near pressure bearing surface at the tip of the capillary tube, which capillary tube includes an inner guide passage for passing wire, wherein the metal splatter results from striking an arc between the end of a length of wire protruding from the tip of the capillary tube, during ball bonding of the wire to semiconductor devices, including the steps of:
depositing a non-conducting coating of oxide of silicon, or oxide of aluminum, on the pressure bearing surfaces of the tip and on the inner surface of the inner guide passage in the region near the pressure bearing surface.

8. The method of claim 7 including the step of depositing the non-conducting layer of oxide of silicon, or oxide of aluminum, on the outer surface of the capillary tube in the region near the pressure bearing surface.

9. The method of claim 8 including the step of depositing the non-conducting layer of oxide of silicon, or oxide of aluminum, to a depth in the range of 2200 angstroms.

10. The method of claim 8 wherein the ceramic capillary tube is made of sintered aluminum oxide.

* * * * *